US012623955B2

(12) United States Patent
Kanehara et al.

(10) Patent No.: US 12,623,955 B2
(45) Date of Patent: May 12, 2026

(54) CHEMICALLY STRENGTHENED GLASS, AND ELECTRONIC DEVICE HOUSING

(71) Applicant: AGC Inc., Tokyo (JP)

(72) Inventors: Kazuki Kanehara, Tokyo (JP); Yutaka Kuroiwa, Tokyo (JP)

(73) Assignee: AGC INC., Tokyo (JP)

( * ) Notice: Subject to any disclaimer, the term of this patent is extended or adjusted under 35 U.S.C. 154(b) by 336 days.

(21) Appl. No.: 18/202,825

(22) Filed: May 26, 2023

(65) Prior Publication Data

US 2023/0322614 A1     Oct. 12, 2023

Related U.S. Application Data

(63) Continuation of application No. PCT/JP2021/032550, filed on Sep. 3, 2021.

(30) Foreign Application Priority Data

Dec. 4, 2020     (JP) ................................. 2020-202039
Jun. 4, 2021     (JP) ................................. 2021-094715

(51) Int. Cl.
B32B 15/04          (2006.01)
B32B 17/06          (2006.01)
(Continued)

(52) U.S. Cl.
CPC .......... C03C 10/0027 (2013.01); C03C 3/083 (2013.01); C03C 3/091 (2013.01);
(Continued)

(58) Field of Classification Search
CPC ................................................... C03C 21/002
(Continued)

(56) References Cited

U.S. PATENT DOCUMENTS 8,883,663 B2 * 11/2014 Beall ...................... C03B 17/064
                                                    501/7
9,593,042 B2 * 3/2017 Hu .......................... C03C 10/00
(Continued)

FOREIGN PATENT DOCUMENTS

CN          110573466 A     12/2019
JP          2011-527105 A    10/2011
(Continued)

OTHER PUBLICATIONS

International Searching Authority, "International Search Report," issued in connection with International Patent Application No. PCT/JP2021/032550, dated Oct. 26, 2021.
(Continued)

*Primary Examiner* — Lauren R Colgan
(74) *Attorney, Agent, or Firm* — Foley & Lardner LLP

(57) ABSTRACT

The present invention relates to a chemically strengthened glass having a thickness of t (unit: μm) and a relative permittivity of 7.0 or less at 20° C. and a frequency of 10 GHz, in which a value of Z determined by the following formula is 0.65 or more, where S1 is an entropy function calculated from an amount of alkali ions in a center portion of the glass, S2 is an entropy function calculated from an average amount of alkali ions from a glass surface to a depth of 0.05t, and X (unit: MPa) is an average value of a compressive stress in a region from the glass surface to the depth of 0.05t: $Z=(S2-S1)\times10+X/1000$.

12 Claims, 1 Drawing Sheet

(51) Int. Cl.

| | |
|---|---|
| *C03C 3/083* | (2006.01) |
| *C03C 3/091* | (2006.01) |
| *C03C 3/093* | (2006.01) |
| *C03C 3/095* | (2006.01) |
| *C03C 3/097* | (2006.01) |
| *C03C 10/00* | (2006.01) |
| *C03C 21/00* | (2006.01) |
| *H05K 5/02* | (2006.01) |

(52) U.S. Cl.
CPC .............. *C03C 3/093* (2013.01); *C03C 3/095* (2013.01); *C03C 3/097* (2013.01); *C03C 10/0054* (2013.01); *C03C 21/002* (2013.01); *C03C 2204/00* (2013.01); *H05K 5/02* (2013.01)

(58) Field of Classification Search
USPC ................................................. 428/410, 426
See application file for complete search history.

(56) References Cited

U.S. PATENT DOCUMENTS

| | | | | |
|---|---|---|---|---|
| 9,604,871 | B2 * | 3/2017 | Amin | ................. C03C 10/0027 |
| 11,535,548 | B2 * | 12/2022 | Murayama | .............. C03C 3/097 |
| 11,572,305 | B2 * | 2/2023 | Murayama | .............. C03C 3/093 |
| 2011/0092353 | A1 * | 4/2011 | Amin | ..................... C03C 10/16 501/3 |
| 2012/0264585 | A1 * | 10/2012 | Ohara | ..................... C03C 3/085 65/30.14 |
| 2013/0186140 | A1 * | 7/2013 | Brix | ........................ C03C 3/083 65/95 |
| 2013/0274085 | A1 | 10/2013 | Beall et al. | |
| 2013/0296155 | A1 | 11/2013 | Beall et al. | |
| 2014/0057092 | A1 | 2/2014 | Beall et al. | |
| 2016/0376186 | A1 | 12/2016 | Gross | |
| 2016/0376187 | A1 | 12/2016 | Gross | |
| 2018/0186685 | A1 | 7/2018 | Murayama et al. | |
| 2018/0265397 | A1 | 9/2018 | Murayama et al. | |
| 2018/0305251 | A1 * | 10/2018 | Ogami | .................. C03C 21/002 |
| 2018/0319706 | A1 * | 11/2018 | Murayama | .............. C03C 3/091 |
| 2018/0327304 | A1 | 11/2018 | Murayama et al. | |
| 2019/0194057 | A1 | 6/2019 | Murayama et al. | |
| 2019/0263713 | A1 | 8/2019 | Murayama et al. | |
| 2019/0292099 | A1 | 9/2019 | Murayama et al. | |
| 2020/0031708 | A1 | 1/2020 | Maeda et al. | |
| 2020/0039876 | A1 * | 2/2020 | Imakita | .................. C03C 3/093 |
| 2020/0239354 | A1 * | 7/2020 | Li | ........................... C03C 3/083 |
| 2020/0325066 | A1 | 10/2020 | Murayama et al. | |
| 2020/0407267 | A1 * | 12/2020 | Nomura | .................. H01Q 1/36 |
| 2021/0013598 | A1 | 1/2021 | Nomura et al. | |
| 2021/0053867 | A1 | 2/2021 | Murayama et al. | |
| 2021/0292225 | A1 | 9/2021 | Umada et al. | |
| 2021/0323862 | A1 * | 10/2021 | Kanehara | ................. C03C 4/14 |
| 2021/0387898 | A1 | 12/2021 | Gross | |
| 2022/0102850 | A1 | 3/2022 | Nomura et al. | |
| 2022/0204400 | A1 | 6/2022 | Imakita et al. | |
| 2022/0274869 | A1 | 9/2022 | Murayama et al. | |
| 2023/0212059 | A1 | 7/2023 | Maeda et al. | |
| 2023/0331620 | A1 | 10/2023 | Maeda et al. | |

FOREIGN PATENT DOCUMENTS

| | | | |
|---|---|---|---|
| JP | 2018-520082 | A | 7/2018 |
| JP | 2018-150230 | A | 9/2018 |
| JP | 2020-033202 | A | 3/2020 |
| WO | WO-2017/126605 | A1 | 7/2017 |
| WO | WO-2018/186402 | A1 | 10/2018 |
| WO | WO-2019/181707 | A1 | 9/2019 |
| WO | WO-2020/121888 | A1 | 6/2020 |
| WO | WO-2020/149236 | A1 | 7/2020 |

OTHER PUBLICATIONS

International Searching Authority, "Written Opinion," issued in connection with International Patent Application No. PCT/JP2021/032550, dated Oct. 26, 2021.

\* cited by examiner

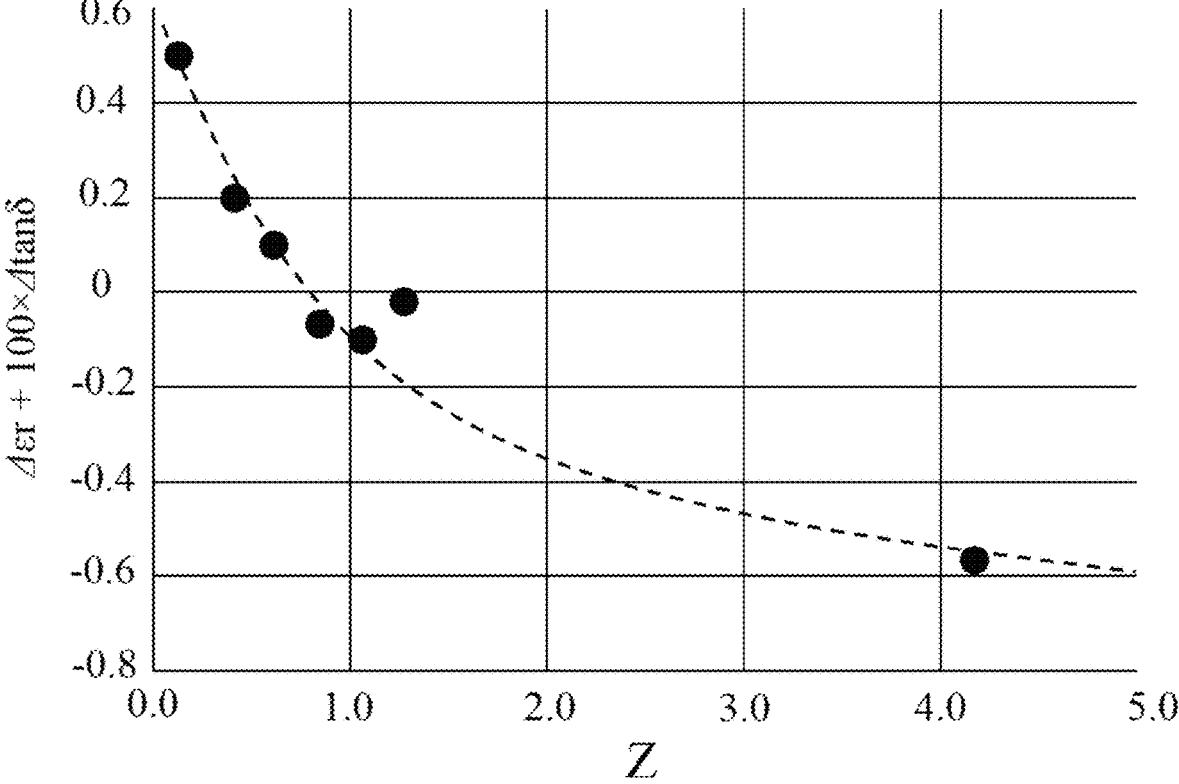

CHEMICALLY STRENGTHENED GLASS, AND ELECTRONIC DEVICE HOUSING

CROSS-REFERENCE TO RELATED APPLICATIONS

This is a continuation of International Application No. PCT/JP2021/032550 filed on Sep. 3, 2021, and claims priority from Japanese Patent Application No. 2020-202039 filed on Dec. 4, 2020 and Japanese Patent Application No. 2021-094715 filed on Jun. 4, 2021, the entire content of which is incorporated herein by reference.

TECHNICAL FIELD

The present invention relates to a chemically strengthened glass and an electronic device housing.

BACKGROUND ART

A chemically strengthened glass is widely used for an electronic device housing such as a mobile terminal since the electronic device housing is required to have sufficient strength to prevent cracking even if the mobile terminal is dropped. The chemically strengthened glass is a glass in which a compressive stress layer is formed on a surface portion of the glass by using a method of immersing the glass into a molten salt such as sodium nitrate to cause ion exchange between alkali ions contained in the glass and alkali ions that have a larger ionic radius and are contained in the molten salt. For example, Patent Literature 1 discloses an aluminosilicate glass having a specific composition and capable of obtaining high surface compressive stress by chemical strengthening.

Further, in an electronic device such as a communication device such as a mobile phone, a smart phone, a mobile information terminal, and a Wi-Fi device, a surface acoustic wave (SAW) device, a radar component and an antenna component, a signal frequency has been further increased in order to increase a communication capacity and a communication speed. In recent years, as a new communication system using a higher frequency band, the fifth generation mobile communication system (5G) is expected to be widely used.

In the high frequency band used in 5G, the cover glass may interfere with radio wave transmission and reception, and a cover glass having excellent dielectric properties such as radio wave transparency is required for a mobile terminal compatible with 5G. As the excellent dielectric properties, for example, it is desirable that a relative permittivity and a dielectric loss are low. Reflection of radio waves can be prevented and radio wave transparency can be improved by reducing the relative permittivity. Loss of radio waves can be prevented by reducing the dielectric loss.

As a glass having high radio wave transparency, that is, a glass having a low relative permittivity and a low dielectric loss tangent in the high frequency band as used in 5G, several alkali-free glasses have been developed so far (Patent Literature 2).

CITATION LIST

Patent Literature

Patent Literature 1: JP2018-520082T
Patent Literature 2: WO 2019/181707

SUMMARY OF INVENTION

Technical Problem

However, it is difficult to chemically strengthen an alkali-free glass containing substantially no alkali ions as disclosed in Patent Literature 2. In addition, it is difficult to predict the radio wave transparency of the chemically strengthened glass, and it is difficult to achieve both the radio wave transparency and strength in a high frequency band.

Therefore, an object of the present invention is to provide a chemically strengthened glass having both excellent radio wave transparency and high strength in a high frequency band.

Solution to Problem

The present inventors have found that, in a high frequency band, there are both a glass whose radio wave transparency after chemical strengthening decreases and a glass whose radio wave transparency after chemical strengthening increases, compared to before the chemical strengthening. Further, the present inventors have found a correlation between surface characteristics and the radio wave transparency after the chemical strengthening of the glass whose radio wave transparency in a high frequency band increases after the chemical strengthening, thereby completing the present invention.

The present invention provides a chemically strengthened glass having a thickness of t (unit: μm) and a relative permittivity of 7.0 or less at 20° C. and a frequency of 10 GHz, in which a value of Z determined by the following formula is 0.65 or more, where S1 is an entropy function calculated from an amount of alkali ions in a center portion of the glass, S2 is an entropy function calculated from an average amount of alkali ions from a glass surface to a depth of 0.05t, and X (unit: MPa) is an average value of a compressive stress in a region from the glass surface to the depth of 0.05t:

$$Z = (S2 - S1) \times 10 + X/1000,$$

provided that an entropy function S is calculated by the following formula from $[Li_2O]$, $[Na_2O]$, and $[K_2O]$ which are contents of $Li_2O$, $Na_2O$, and $K_2O$ respectively in terms of molar percentage based on oxides, and in the formula, when $[Li_2O]$, $[Na_2O]$, and $[K_2O]$ are zero, the entropy function S is $1 \times 10^{-4}$:

$$S = -[Li_2O]/([Li_2O]+[Na_2O]+[K_2O])log([Li_2O]/ \\ ([Li_2O]+[Na_2O]+[K_2O]))-[Na_2O]/([Li_2O]+ \\ [Na_2O]+[K_2O])log([Na_2O]/([Li_2O]+[Na_2O]+ \\ [K_2O]))-[K_2O]/([Li_2O]+[Na_2O]+[K_2O])log \\ ([K_2O]/([Li_2O]+[Na_2O]+[K_2O])).$$

In the chemically strengthened glass of the present invention (hereinafter, also referred to as the present chemically strengthened glass), a value of (S2−S1), obtained by subtracting the entropy function S1 from the entropy function S2, is preferably 0.04 or more.

A dielectric loss tangent of the present chemically strengthened glass at 20° C. and a frequency of 10 GHz is preferably 0.02 or less.

In the present chemically strengthened glass, a base composition preferably includes, in terms of molar percentage based on oxides:

40% to 80% of $SiO_2$;
0% to 20% of $B_2O_3$;

1% to 25% of $Al_2O_3$; and

5% to 30% of $Li_2O$ and/or $Na_2O$ in total.

In the present chemically strengthened glass, a surface compressive stress value $CS_0$ is preferably 300 MPa or more.

In the present chemically strengthened glass, an internal chemical strengthening stress $CS_{0.05t}$ at a depth of 0.05t from the glass surface is preferably 75 MPa or more, and the thickness t is preferably 300 μm or more.

In the present chemically strengthened glass, a depth of a compressive stress layer DOL is preferably 70 μm or more, and the thickness t is preferably 350 μm or more.

The present chemically strengthened glass is preferably a lithium aluminosilicate glass, in which the base composition includes, in terms of molar percentage based on oxides:

40% to 70% of $SiO_2$;

7.5% to 20% of $Al_2O_3$; and

5% to 25% of $Li_2O$.

In the present chemically strengthened glass, the thickness t is preferably 100 μm or more and 2000 μm or less.

The present chemically strengthened glass is preferably a glass ceramic.

The present invention also provides an electronic device housing including the present chemically strengthened glass.

Advantageous Effects of Invention

In the chemically strengthened glass of the present invention, Z, which is calculated by a formula represented by an entropy function S representing a degree of mixing of alkali metal ions and an average value X of compressive stress, is in a specific range, and movement of the alkali metal ions in the glass is suppressed. Accordingly, the chemically strengthened glass of the present invention is excellent in strength and exhibits excellent radio wave transparency in a high frequency band.

BRIEF DESCRIPTION OF DRAWINGS

The FIGURE is a graph showing a correlation between the amount of change in total value of a relative permittivity and a dielectric loss tangent before and after chemical strengthening, which are important for radio wave transparency at a frequency of 10 GHz, and an entropy function and compressive stress. A vertical axis represents a total value of the relative permittivity and a value acquired by multiplying the dielectric loss tangent by 100, which is changed before and after chemical strengthening, and a horizontal axis represents a parameter Z that can be calculated from the entropy function and the compressive stress before and after chemical strengthening. The radio wave transparency is determined by both the relative permittivity and the dielectric loss tangent, but since the relative permittivity has a larger absolute value and a higher effect than the dielectric loss tangent, the radio wave transparency is represented by a total value of the relative permittivity and 100 times the dielectric loss tangent.

DESCRIPTION OF EMBODIMENTS

In the present specification, the expression "to" indicating a numerical range is used to include the numerical values described therebefore and thereafter as the lower limit value and the upper limit value. Hereinafter, the expression "to" in the present specification is used with the same meaning unless otherwise specified.

In the present specification, the term "chemically strengthened glass" refers to a glass after being subjected to a chemical strengthening treatment, and the term "glass for chemical strengthening" refers to a glass before being subjected to a chemical strengthening treatment.

In the present specification, the term "base composition of the chemically strengthened glass" is a glass composition of the glass for chemical strengthening. In the chemically strengthened glass, a glass composition at a depth of ½ of a thickness t is the base composition of the chemically strengthened glass except for a case where an extreme ion exchange treatment is performed.

In the present specification, the glass composition is expressed in terms of molar percentage based on oxides unless otherwise specified, and mol % is simply expressed as "%".

In addition, in the present specification, "not substantially contained" means that an amount of a component is equal to or lower than a level of an impurity contained in a raw material or the like, that is, the component is not intentionally contained. Specifically, the amount is, for example, less than 0.1 mol %.

In the present specification, the term "stress profile" represents a compressive stress value with the depth from a glass surface as a variable. The term "depth of compressive stress layer (DOL)" is a depth at which a compressive stress value (CS) is zero. The term "internal tensile stress value (CT)" refers to a tensile stress value at a depth of ½ of the thickness t of the glass. In the present specification, the tensile stress value is expressed as a negative compressive stress value.

The stress profile in the present specification can be measured using a scattered light photoelastic stress meter (for example, SLP-1000 manufactured by Orihara Industrial Co., Ltd.). The scattered light photoelastic stress meter is affected by surface scattering, and measurement accuracy in a vicinity of a sample surface may decrease. However, for example, in a case where compressive stress is generated only by ion exchange between lithium ions in a glass and external sodium ions, a compressive stress value represented by a function of a depth follows a complementary error function, and thus a stress value of a surface can be known by measuring an internal stress value. When the compressive stress value does not follow the complementary error function, the surface portion is measured by another method, for example, a method of measuring with a surface stress meter.

<Chemically Strengthened Glass>

The chemically strengthened glass of the present invention is a chemically strengthened glass having a thickness of t (unit: μm) and a relative permittivity of 7.0 or less at a frequency of 10 GHz, in which a value of Z, calculated by a formula $Z=(S2-S1)\times10+X/1000$, is 0.65 or more, where S1 is an entropy function calculated from the amount of alkali ions in a center portion of the glass, S2 is an entropy function calculated from the average amount of alkali ions from a glass surface to a depth of 0.05t, and X (unit: MPa) is an average value of compressive stress in a region from the glass surface to the depth of 0.05t.

Here, the entropy function S is calculated by the following formula from contents $[Li_2O]$, $[Na_2O]$, and $[K_2O]$ of $Li_2O$, $Na_2O$, and $K_2O$ at each depth in terms of molar percentage based on oxides. In the following formula, when $[Li_2O]$, $[Na_2O]$, and $[K_2O]$ are zero, the entropy function S is $1\times10^{-4}$.

$$S=-[Li_2O]/([Li_2O]+[Na_2O]+[K_2O])\log([Li_2O]/([Li_2O]+[Na_2O]+[K_2O]))-[Na_2O]/([Li_2O]+[Na_2O]+[K_2O])\log([Na_2O]/([Li_2O]+[Na_2O]+$$

US 12,623,955 B2

5

$[K_2O]))-[K_2O]/([Li_2O]+[Na_2O]+[K_2O])\log$
$([K_2O]/([Li_2O]+[Na_2O]+[K_2O]))$ In the related art, since the radio wave transparency of the chemically strengthened glass changes with a change in frequency, it is difficult to predict the radio wave transparency, and it is difficult to achieve both the radio wave transparency and strength in a high frequency band. The present inventors have focused on a relationship between radio wave transparency in a high frequency band and chemical strengthening, and have found that there are a glass whose radio wave transparency in a high frequency band increases after the chemical strengthening and a glass whose radio wave transparency in a high frequency band decreases after the chemical strengthening compared to before the chemical strengthening.

Furthermore, the present inventors have considered that features of the glass whose radio wave transparency in a high frequency band increases after the chemical strengthening compared to before the chemical strengthening are both 1) that a mixing degree of alkali ions is greatly changed between before and after the chemical strengthening and 2) that high compressive stress is present after the chemical strengthening. Hereinafter, the features 1) and 2) will be described.

The radio wave transparency increases by reducing the relative permittivity and a dielectric loss. Since the relative permittivity and the dielectric loss are mainly caused by movement of alkali metal ions in the glass, it is considered that the relative permittivity and the dielectric loss can be reduced by preventing the movement of alkali metal ions in the glass by the chemical strengthening treatment.

Regarding the feature 1) that the mixing degree of alkali ions is greatly changed between before and after the chemical strengthening, it is considered that different types of alkali metal ions are present and mixed in glass, and thus exchange between alkali metal ions is less likely to occur, the relative permittivity and the dielectric loss decrease, and dielectric properties are improved. The mixing degree of alkali metal ions is represented by an entropy function.

Regarding the feature 2) that the high compressive stress is present after the chemical strengthening, it is considered that when the compressive stress is high, the movement of alkali metal ions is prevented, the relative permittivity and the dielectric loss decrease, and the dielectric properties are improved.

The FIGURE is a graph showing a correlation between the amount of change in total value of a relative permittivity and a dielectric loss tangent before and after the chemical strengthening, which are important for radio wave transparency at a frequency of 10 GHz, and an entropy function and compressive stress of the glass whose radio wave transparency increases after the chemical strengthening compared to before the chemical strengthening in Experimental Example 1 to be described later. In the FIGURE, a vertical axis represents a total value of the relative permittivity and a value acquired by multiplying the dielectric loss tangent by 100, which is changed between before and after chemical strengthening, and a horizontal axis represents a parameter Z that can be calculated from the entropy function and the compressive stress before and after chemical strengthening. The radio wave transparency is determined by both the relative permittivity and the dielectric loss tangent, but since the relative permittivity has a larger absolute value and a higher effect than the dielectric loss tangent, the radio wave transparency is represented by a total value of the amount of change in relative permittivity and a value acquired by multiplying the amount of change in dielectric loss tangent by 100. Details of Experimental Example 1 will be described later.

A content of alkali metal ions for calculating an entropy function is measured using Electron Probe Micro Analyzer (EPMA, JXA-8500F manufactured by JEOL Ltd.). Measurement conditions of EPMA are an acceleration voltage of 15 kV, a probe current of 30 nA, an integration time 1000 msec./point, and an interval of 1 m.

According to the FIGURE, it can be seen that since Z represented by the formula $[Z=(S2-S1)\times10+X/1000]$ is 0.65 or more, the movement of alkali metal ions after the chemical strengthening is prevented compared to before the chemical strengthening, and excellent radio wave transparency is exhibited in a high frequency band.

The fact that the movement of alkali metal ions after the chemical strengthening is prevented compared to before the chemical strengthening and the radio wave transparency is improved by the chemical strengthening can be evaluated by the amount of change in relative permittivity due to the chemical strengthening and the amount of change in dielectric loss due to the chemical strengthening.

Specifically, for example, a value acquired by subtracting "the relative permittivity at 20° C. and 10 GHz after the chemical strengthening" from "the relative permittivity at 20° C. and 10 GHz before the chemical strengthening" is preferably 0 or more, more preferably 0.02 or more, still more preferably 0.04 or more, yet still more preferably 0.06 or more, particularly preferably 0.08 or more, even still more preferably 0.1 or more, and most preferably 0.12 or more. Since the relative permittivity of the glass after the chemical strengthening is decreased by 0 or more compared to before the chemical strengthening, it can be evaluated that the relative permittivity is decreased by the chemical strengthening and the radio wave transparency is improved.

In addition, for example, a value acquired by subtracting "the dielectric loss tangent at 20° C. and 10 GHz after the chemical strengthening" from "the dielectric loss tangent at 20° C. and 10 GHz before the chemical strengthening" is preferably 0 or more, more preferably 0.001 or more, still more preferably 0.002 or more, yet still more preferably 0.003 or more, and particularly preferably 0.004 or more. Since the dielectric loss tangent of the glass after the chemical strengthening is decreased by 0 or more compared to before the chemical strengthening, it can be evaluated that the dielectric loss is decreased by the chemical strengthening and the radio wave transparency is improved.

Among the dielectric properties of the glass, the dielectric property of a glass surface layer is particularly important in a case of designing a circuit on a glass substrate in the high frequency band. Since the relative permittivity and the dielectric loss tangent of a surface of a glass sheet are smaller than the relative permittivity and the dielectric loss tangent of an inside of the glass in the high frequency band, the chemically strengthened glass of the present invention can be efficiently transmitted with radio waves and has excellent dielectric properties of the glass surface layer.

Z represented by the formula $[Z=(S2-S1)\times10+X/1000]$ is 0.65 or more, preferably 0.7 or more, more preferably 0.8 or more, still more preferably 0.9 or more, yet still more preferably 1.0 or more, particularly preferably 1.25 or more, even still more preferably 1.5 or more, and most preferably 2.0 or more. When Z is 0.65 or more, the movement of alkali metal ions after the chemical strengthening is prevented, and excellent radio wave transparency is exhibited in the high frequency band. The value of Z can be adjusted by compositions of the glass for chemical strengthening and chemical strengthening treatment conditions (molten salt compositions, time, temperature, and the like).

In the formula, S1 is an entropy function calculated from the amount of alkali ions in the center portion of the glass, and S2 is an entropy function calculated from the average amount of alkali ions from the glass surface to the depth of 0.05t.

The value of S1 is not particularly limited, but the lower the S1 is, the better chemical strengthening properties can be obtained. For example, The value of S1 is preferably 0.375 or less, more preferably 0.35 or less, still more preferably 0.325 or less, yet still more preferably 0.30 or less, particularly preferably 0.25 or less, even still more preferably 0.20 or less, and most preferably 0.15 or less. On the other hand, when S1 is too low, the relative permittivity and the dielectric loss tangent cannot be lowered even if the chemical strengthening is performed, and therefore, S1 is preferably 0.0 or more.

The value of S2 is not particularly limited, but the higher the S2, the lower the relative permittivity and the dielectric loss tangent of the glass after the chemical strengthening tend to be, and the better the radio wave transparency after the chemical strengthening tends to be. For example, the value of S2 is preferably 0.2 or more, more preferably 0.25 or more, still more preferably 0.3 or more, yet still more preferably 0.35 or more, particularly preferably 0.40 or more, and even still more preferably 0.45 or more. On the other hand, when S2 is too high, the chemical strengthening stress is insufficient, and for example, S2 is preferably 0.5 or less, more preferably 0.49 or less, still more preferably 0.48 or less, yet still more preferably 0.47 or less, and particularly preferably 0.46 or less.

The value (S2−S1) acquired by subtracting S1 from S2 is not particularly limited, but when the value is high, the relative permittivity and the dielectric loss tangent can be reduced after the chemical strengthening. Therefore, the value is preferably 0.04 or more, more preferably 0.05 or more, still more preferably 0.1 or more, yet still more preferably 0.15 or more, particularly preferably 0.2 or more, even still more preferably 0.25 or more, and most preferably 0.3 or more. On the other hand, when the value acquired by subtracting S1 from S2 is too high, a sufficient chemical strengthening stress is not applied, and thus the value is preferably 0.5 or less, more preferably 0.48 or less, still more preferably 0.46 or less, yet still more preferably 0.44 or less, particularly preferably 0.42 or less, even still more preferably 0.40 or less, and most preferably 0.38 or less.

By setting S1 and S2 within the above ranges, it is possible to increase the mixing degree of the alkali metal ions by the chemical strengthening to prevent the movement of the alkali metal ions in the glass surface layer, and improve the radio wave transparency in the high frequency band. S1 and S2 can be adjusted by the compositions of the glass for chemical strengthening and the chemical strengthening treatment conditions (molten salt compositions, time, temperature, and the like).

X in the formula is an average value [unit: MPa] of the compressive stress in the region from the glass surface to the depth of 0.05t. The value of X is not particularly limited, but is, for example, preferably 100 MPa or more, more preferably 150 MPa or more, still more preferably 200 MPa or more, yet still more preferably 250 MPa or more, particularly preferably 275 MPa or more, even still more preferably 300 MPa or more, and most preferably 320 MPa or more. By setting X within the above range, the high compressive stress can be introduced into the glass surface layer to prevent the movement of the alkali metal ions in the glass surface layer, and the dielectric properties in the high frequency band can be improved. On the other hand, if the value of X is too high, the glass is explosively broken into small pieces when crushed, and thus, the value is preferably 600 MPa or less, more preferably 500 MPa or less, still more preferably 475 MPa or less, yet still more preferably 450 MPa or less, particularly preferably 425 MPa or less, even still more preferably 400 MPa or less, and most preferably 375 MPa or less. The value of X can be adjusted by the compositions of the glass for chemical strengthening and the chemical strengthening treatment conditions (molten salt compositions, time, temperature, and the like).

The present chemically strengthened glass is preferably in the form of a sheet. In addition, the glass sheet may have an edged shape in which thicknesses of an outer periphery are different. The form of the glass sheet is not limited thereto, and for example, two main surfaces may not be parallel to each other, and all or a part of one or both of the two main surfaces may be curved surfaces. More specifically, the glass sheet may be, for example, a flat sheet-shaped glass sheet having no warpage or a curved glass sheet having a curved surface.

The thickness (t) of the glass is, for example, 2000 μm or less, preferably 1500 μm or less, more preferably 1000 μm or less, still more preferably 900 μm or less, particularly preferably 800 μm or less, and most preferably 700 μm or less, from the viewpoint of increasing a chemical strengthening effect. The thickness is, for example, 100 μm or more, preferably 200 m or more, more preferably 300 μm or more, still more preferably 350 μm or more, yet more preferably 400 μm or more, and particularly preferably 500 μm or more, from the viewpoint of obtaining a sufficient effect of improving strength by the chemical strengthening treatment.

A shape of the present chemically strengthened glass may be a shape other than a sheet shape depending on a product, a use, or the like to which the present chemically strengthened glass is applied.

The relative permittivity of the present chemically strengthened glass at 20° C. and a frequency of 10 GHz is 7.0 or less, preferably 6.9 or less, more preferably 6.8 or less, still more preferably 6.7 or less, yet more preferably 6.6 or less, particularly preferably 6.5 or less, even still more preferably 6.4 or less, and most preferably 6.3 or less. When the relative permittivity is small, a loss of radio waves due to reflection on glass surface can be prevented, and thus the radio wave transparency tends to be good. On the other hand, when the relative permittivity is too low, a glass to which sufficient chemical strengthening stress is not applied is obtained, and thus the relative permittivity is preferably 4.0 or more, more preferably 4.2 or more, still more preferably 4.4 or more, yet still more preferably 4.6 or more, particularly preferably 4.8 or more, even still more preferably 5.0 or more, and most preferably 5.2 or more. The value of the relative permittivity at 20° C. and a frequency of 10 GHz can be measured by a split post dielectric resonator method (a SPDR method) using a network analyzer.

The dielectric loss tangent (tan α) of the present chemically strengthened glass at 20° C. and a frequency of 10 GHz is preferably 0.02 or less, more preferably 0.018 or less, still more preferably 0.016 or less, yet still more preferably 0.014 or less, particularly preferably 0.012 or less, even still more preferably 0.011 or less, and most preferably 0.010 or less. When the dielectric loss tangent is small, a loss when the radio waves pass through the glass can be prevented, and thus the radio wave transparency tends to be good. On the other hand, when the dielectric loss tangent is too low, a glass to which sufficient chemical strengthening stress can be applied is not obtained, and thus the dielectric loss tangent is preferably 0.001 or more, more preferably 0.002 or more, still more preferably 0.003 or more, yet still more preferably 0.004 or more, particularly preferably 0.005 or more, even still more preferably 0.006 or more, and most preferably 0.007 or more. The value of the dielectric loss tangent (tan $\alpha$) at 20° C. and a frequency of 10 GHz can be measured by the split post dielectric resonator method (the SPDR method) using the network analyzer.

It is preferable that the values of the relative permittivity and the dielectric loss tangent at 20° C. and the frequency of 10 GHz and the values of the relative permittivity and the dielectric loss tangent at a higher frequency are brought close to each other to reduce frequency dependence (dielectric dispersion), so that frequency characteristics of dielectric properties are hardly changed, and a design change is reduced even when frequencies during use are different. The relative permittivity and the dielectric loss tangent can be adjusted by the compositions of the glass and the chemical strengthening conditions.

Since an alkali content of the present chemically strengthened glass is appropriately adjusted in a glass composition, the relative permittivity and the dielectric loss tangent at the frequency of 10 GHz can be reduced. In general, in a frequency range of about 10 GHz to 40 GHz, the relative permittivity and the dielectric loss tangent of the glass have small frequency dependence, and thus the present chemically strengthened glass having excellent dielectric properties at the frequency of 10 GHz has excellent radio wave transparency even in a band of 28 GHz, 35 GHz, or the like used in 5G.

The relative permittivity and the dielectric loss tangent can be measured by the split post dielectric resonator method (the SPDR method) using the network analyzer.

The present chemically strengthened glass is obtained by chemically strengthening a glass for chemical strengthening or glass ceramics to be described later. That is, the base composition of the present chemically strengthened glass is the same as a glass composition of the glass for chemical strengthening to be described later, and a preferable composition range is also the same. An average composition of the present chemically strengthened glass is the same as a composition of the glass for chemical strengthening or the glass ceramics to be described later. Here, the average composition refers to a composition obtained by analyzing a finely pulverized glass sample that has been subjected to a heat treatment from a glass state.

The internal chemical strengthening stress $CS_{0.05t}$ of the present chemically strengthened glass is preferably 100 MPa or more, more preferably 150 MPa or more, still more preferably 200 MPa or more, yet still more preferably 225 MPa or more, and particularly preferably 250 MPa or more. A surface compressive stress value $CS_0$ is preferably 300 MPa or more, more preferably 400 MPa or more, and still more preferably 500 MPa or more because excellent strength is easily obtained and a compressive stress value $CS_{50}$ at a depth of 50 m from the surface is also easily increased.

The strength increases as the surface compressive stress value $CS_0$ increases, but when the surface compressive stress value $CS_0$ is too large, large tensile stress is generated inside the chemically strengthened glass, which may lead to fracture, and thus the surface compressive stress value $CS_0$ is preferably 1000 MPa or less, and more preferably 800 MPa or less.

In a stress profile of the present chemically strengthened glass, the compressive stress value $CS_{50}$ at the depth of 50

$\mu$m from the surface is preferably 75 MPa or more, more preferably 90 MPa or more, still more preferably 100 MPa or more, and particularly preferably 125 MPa or more. When the $CS_{50}$ is large, the chemically strengthened glass is less likely to crack when damaged due to dropping or the like.

An internal tensile stress value CT of the present chemically strengthened glass is preferably 80 MPa or less, and more preferably 75 MPa or less. When the CT is small, crushing hardly occurs. The internal tensile stress value CT is preferably 50 MPa or more, more preferably 60 MPa or more, and still more preferably 65 MPa or more. When the CT is equal to or greater than the above value, the compressive stress in a vicinity of the surface increases, and the strength increases.

When a depth of compressive stress layer (DOL) of the present chemically strengthened glass is too large with respect to the thickness t, the CT is increased, and thus the DOL is preferably 0.25t or less, more preferably 0.2t or less, still more preferably 0.19t or less, and yet more preferably 0.18t or less. In addition, from the viewpoint of improving the strength, the DOL is preferably 0.06t or more, more preferably 0.08t or more, still more preferably 0.10t or more, and particularly preferably 0.12t or more.

Specifically, for example, when the thickness t is 700 m, the DOL is preferably 140 m or less, and more preferably 133 $\mu$m or less. The DOL is preferably 70 $\mu$m or more, more preferably 80 $\mu$m or more, and still more preferably 90 $\mu$m or more. A preferable thickness (t) and a preferable shape of the present chemically strengthened glass are the same as the preferable thickness (t) and the shape of the present glass described above.

In order to make the glass harder to crush, a Young's modulus of the present chemically strengthened glass is preferably 50 GPa or more, more preferably 80 GPa or more, and still more preferably 85 GPa or more. An upper limit of the Young's modulus is not particularly limited, but a glass having a high Young's modulus may have low acid resistance, and thus the Young's modulus is, for example, 110 GPa or less, preferably 100 GPa or less, and more preferably 90 GPa or less. The Young's modulus can be measured by, for example, an ultrasonic pulse method.

Four-point bending strength of the present chemically strengthened glass is preferably 350 MPa or more, more preferably 450 MPa or more, and still more preferably 400 MPa or more. An upper limit of the four-point bending strength is not particularly limited, but is typically 1000 MPa or less. The four-point bending strength is measured by a method defined in JIS R1601: 2008.

The Vickers hardness of the surface of the present chemically strengthened glass is preferably 4.4 GPa or more, more preferably 4.8 GPa or more, and still more preferably 5.2 GPa or more. An upper limit of the Vickers hardness is not particularly limited, but is typically 9.0 GPa or less. The Vickers hardness is the Vickers hardness (HV 0.1) defined in JIS R1610: 2003.

Thermal conductivity of the present chemically strengthened glass is preferably 2.0 W/m° C. or less, more preferably 1.8 W/m° C. or less, and still more preferably 1.5 W/m° C. or less. A lower limit of the thermal conductivity is not particularly limited, but is typically 0.8 W/m° C. or more.

The present chemically strengthened glass is particularly useful as a cover glass used for a mobile device such as a mobile phone, a smartphone, a personal digital assistant (PDA), and a tablet terminal. Further, the present chemically strengthened glass is also useful for applications such as a cover glass of a display device such as a television (TV), a personal computer (PC), and a touch panel, an elevator wall surface, a wall surface (full-screen display) of a construction such as a house and a building, a building material such as a window glass, a tabletop, an interior of an automobile, an airplane, or the like, and a cover glass thereof, or a casing having a curved surface shape that is not a sheet shape by bending or molding, which are not intended to be carried.

<Method for Producing Chemically Strengthened Glass>

The present chemically strengthened glass can be produced by chemically strengthening a glass for chemical strengthening (hereinafter, also referred to as "the present glass for chemical strengthening") to be described below.

<<Glass for Chemical Strengthening>>

The present glass for chemical strengthening is preferably a soda-lime glass, an alkali aluminosilicate glass, or an alkali aluminoborosilicate glass. These glasses are suitable for the chemical strengthening treatment.

The present glass for chemical strengthening is more preferably a lithium aluminosilicate glass. The lithium aluminosilicate glass contains lithium ions that are alkali ions having the smallest ion radius, and thus a chemically strengthened glass having a preferable stress profile and excellent strength can be easily obtained by a chemical strengthening treatment in which ions are exchanged using various molten salts.

Specifically, the present glass for chemical strengthening preferably contains:

40% to 80% of $SiO_2$;

0% to 20% of $B_2O_3$;

1% to 25% of $Al_2O_3$; and

5% to 30% of $Li_2O$ and/or $Na_2O$ in a total amount.

The lithium aluminosilicate glass preferably contains:

40% to 70% of $SiO_2$;

7.5% to 20% of $Al_2O_3$; and

5% to 25% of $Li_2O$.

Hereinafter, a preferable composition of the present glass for chemical strengthening will be further described.

$SiO_2$ is a component constituting a network of a glass. In addition, $SiO_2$ is a component that increases chemical durability, and is a component that reduces the occurrence of cracks when the glass surface is scratched.

In order to improve the chemical durability, a content of $SiO_2$ is preferably 40% or more, more preferably 50% or more, still more preferably 55% or more, yet still more preferably 56% or more, particularly preferably 63% or more, and most preferably 65% or more. In order to improve the meltability during glass production, the content of $SiO_2$ is preferably 80% or less, more preferably 75% or less, still more preferably 70% or less, particularly preferably 68% or less, and most preferably 65% or less.

$Al_2O_3$ is an effective component from the viewpoint of improving ion exchangeability during chemical strengthening and increasing a surface compressive stress after strengthening.

In order to improve the chemical durability and to improve the chemical strengthening properties, a content of $Al_2O_3$ is preferably 1% or more, more preferably 3% or more, still more preferably 5% or more, yet still more preferably 7% or more, even still more preferably 9.1% or more, further still more preferably 10% or more, particularly preferably 11% or more, and most preferably 12% or more. On the other hand, when the content of $Al_2O_3$ is too high, crystals may tend to grow during melting. In order to prevent a decrease in yield due to devitrification defects, the content of $Al_2O_3$ is preferably 25% or less, more preferably 23% or less, still more preferably 21% or less, particularly preferably 20% or less, and most preferably 19% or less.

Both $SiO_2$ and $Al_2O_3$ are components that stabilize a structure of the glass, and in order to reduce brittleness, a total content thereof is preferably 57.5% or more, more preferably 65% or more, still more preferably 75% or more, yet still more preferably 77% or more, and particularly preferably 79% or more.

Both $SiO_2$ and $Al_2O_3$ tend to increase a melting temperature of the glass. Therefore, in order to facilitate melting, the total content thereof is preferably 95% or less, more preferably 90% or less, still more preferably 87% or less, yet still more preferably 85% or less, and particularly preferably 82% or less.

$Li_2O$ is a component that forms a surface compressive stress by ion exchange, and is a component that improves the meltability of the glass. When the chemically strengthened glass contains $Li_2O$, a stress profile having a large surface compressive stress and a large compressive stress layer can be obtained by ion-exchanging Li ions of the glass surface with Na ions, and Na ions with K ions.

In order to increase the surface compressive stress during the chemical strengthening, a content of $Li_2O$ is preferably 5% or more, more preferably 6.5% or more, still more preferably 7.1% or more, particularly preferably 7.5% or more, and most preferably 8% or more.

On the other hand, when the content of $Li_2O$ is too high, a crystal growth rate during glass molding increases, and a problem of a decrease in yield due to devitrification defects may increase. In order to prevent devitrification in a glass production process, the content of $Li_2O$ is preferably 18% or less, more preferably 16% or less, still more preferably 15% or less, yet still more preferably 14% or less, and particularly preferably 12% or less. In addition, when a content of the alkali ions is too high, the radio wave transparency tends to decrease, and thus the content of $Li_2O$ is preferably 12% or less, more preferably 10% or less, and still more preferably 9% or less from the viewpoint of improving the radio wave transparency.

From the viewpoint of facilitating molding of the glass, a total content of $Li_2O$ and/or $Na_2O$ is preferably 5% or more, more preferably 7.5% or more, and still more preferably 10% or more. In addition, from the viewpoint of preventing the glass from dissolving in water or the like, the total content of $Li_2O$ and/or $Na_2O$ is preferably 30% or less, more preferably 25% or less, and still more preferably 20% or less.

Neither $Na_2O$ nor $K_2O$ is essential, but is a component that improves the meltability of the glass and decreases the crystal growth rate of the glass, and is preferably contained in order to improve the ion exchangeability.

$Na_2O$ is a component that forms a surface compressive stress layer in a chemical strengthening treatment using a potassium salt, and is also a component that can improve the meltability of the glass. In order to obtain the effect, a content of $Na_2O$ is preferably 1.5% or more, more preferably 2.5% or more, still more preferably 3% or more, yet still more preferably 3.6% or more, and particularly preferably 4% or more. On the other hand, when the content of $Na_2O$ is too high, the compressive stress at a relatively deep portion from the surface is difficult to be increased by the chemical strengthening, and thus the content is preferably 10% or less, more preferably 7% or less, still more preferably 5% or less, and yet still more preferably 3% or less.

$K_2O$ may be contained for a purpose of preventing devitrification in the glass production process. In a case where $K_2O$ is contained, a content of $K_2O$ is preferably 0.1% or more, more preferably 0.15% or more, and particularly preferably 0.2% or more. In order to further prevent devitrification, the content is preferably 0.5% or more, and more preferably 1.2% or more. Since a large amount of K causes brittleness and a decrease in surface layer stress due to reverse exchange during strengthening, the content of $K_2O$ is preferably 4% or less, more preferably 3% or less, still more preferably 2% or less, yet still more preferably 1% or less, and particularly preferably 0.5% or less.

In order to increase the meltability of the glass, a total content ($[Na_2O]+[K_2O]$) of $Na_2O$ and $K_2O$ is preferably 2% or more, more preferably 2.5% or more, still more preferably 3% or more, and particularly preferably 3.5% or more. When ($[Na_2O]+[K_2O]$) is too high, a decrease in the surface compressive stress value tends to occur, and thus ($[Na_2O]+[K_2O]$) is preferably 10% or less, more preferably 8% or less, still more preferably 7% or less, and particularly preferably 6% or less. Coexistence of $Na_2O$ and $K_2O$ is preferable from the viewpoint of the radio wave transparency because the movement of an alkali component is prevented.

In the present glass for chemical strengthening, from the viewpoint of the radio wave transparency, a ratio $[[Li_2O]/([Na_2O]+[K_2O])]$ of the content of $Li_2O$ to the total content ($[Na_2O]+[K_2O]$) of $Na_2O$ and $K_2O$ is preferably 1 or more, more preferably 2 or more, still more preferably 3 or more, and particularly preferably 5 or more. When $[[Li_2O]/([Na_2O]+[K_2O])]$ is within the above range, the movement of the alkali component can be prevented. An upper limit of $[[Li_2O]/([Na_2O]+[K_2O])]$ is not particularly limited, but is typically 20 or less.

None of MgO, CaO, SrO, and BaO is essential, but one or more of MgO, CaO, SrO, and BaO may be contained from the viewpoint of enhancing stability of the glass or improving the chemical strengthening properties. In a case of containing these, a total content $[MgO]+[CaO]+[SrO]+[BaO]$ of one or more selected from MgO, CaO, SrO, and BaO is preferably 1% or more, more preferably 2% or more, and still more preferably 4% or more. From the viewpoint of obtaining sufficient chemical strengthening stress during the chemical strengthening or increasing the radio wave transparency, the total content thereof is preferably 20% or less, and more preferably 10% or less.

MgO may be contained in order to decrease viscosity during melting. In a case where MgO is contained, a content of MgO is preferably 1% or more, more preferably 2% or more, and still more preferably 3% or more. On the other hand, when the content of MgO is too high, it is difficult to increase the compressive stress layer during the chemical strengthening treatment. The content of MgO is preferably 5% or less, more preferably 4% or less, still more preferably 3% or less, and particularly preferably 2% or less.

CaO is a component for improving the meltability of the glass, and may be contained. In a case where CaO is contained, a content of CaO is preferably 0.1% or more, more preferably 0.15% or more, and still more preferably 0.5% or more. On the other hand, when the content of CaO is excessive, it is difficult to increase the compressive stress value during the chemical strengthening treatment. The content of CaO is preferably 5% or less, more preferably 3% or less, still more preferably 1% or less, and typically 0.5% or less.

ZnO is a component for improving meltability of a glass, and may be contained. In a case where ZnO is contained, a content of ZnO is preferably 0.2% or more, and more preferably 0.5% or more. In order to increase weather resistance of the glass, the content of ZnO is preferably 8% or less, more preferably 5% or less, and still more preferably 3% or less.

ZnO, SrO, and BaO tend to deteriorate the chemical strengthening properties, and thus, in order to facilitate the chemical strengthening, $[ZnO]+[SrO]+[BaO]$ is preferably less than 1%, and more preferably 0.5% or less. It is more preferable that ZnO, SrO, and BaO are not substantially contained.

$ZrO_2$ may not be contained, but is preferably contained from the viewpoint of increasing the surface compressive stress of the chemically strengthened glass. A content of $ZrO_2$ is preferably 0.1% or more, more preferably 0.15% or more, still more preferably 0.2% or more, particularly preferably 0.25% or more, and typically 0.3% or more. On the other hand, when the content of $ZrO_2$ is too high, the devitrification defects are likely to occur, and the compressive stress value is hardly increased during the chemical strengthening treatment. The content of $ZrO_2$ is preferably 2% or less, more preferably 1.5% or less, still more preferably 1% or less, and particularly preferably 0.8% or less.

A content of $Y_2O_3$ is preferably 0.1% or more, more preferably 0.2% or more, still more preferably 0.5% or more, and particularly preferably 1% or more. On the other hand, when the content is too high, it is difficult to increase the compressive stress layer during the chemical strengthening treatment. The content of $Y_2O_3$ is preferably 10% or less, more preferably 8% or less, still more preferably 5% or less, yet still more preferably 3% or less, particularly preferably 2% or less, and further particularly preferably 1.5% or less.

$La_2O_3$ is not essential, but may be contained for the same reason as $Y_2O_3$. The content of $La_2O_3$ is preferably 0.1% or more, more preferably 0.2% or more, still more preferably 0.5% or more, and particularly preferably 0.8% or more. On the other hand, when the content of $La_2O_3$ is too high, it is difficult to increase the compressive stress layer during the chemical strengthening treatment, and thus, the content of $La_2O_3$ is preferably 5% or less, more preferably 3% or less, still more preferably 2% or less, and particularly preferably 1.5% or less.

$TiO_2$ is a component that prevents solarization of the glass, and may be contained. In a case where $TiO_2$ is contained, a content of $TiO_2$ is preferably 0.02% or more, more preferably 0.03% or more, still more preferably 0.04% or more, particularly preferably 0.05% or more, and typically 0.06% or more. On the other hand, when the content of $TiO_2$ is more than 1%, the devitrification is likely to occur, and the quality of the chemically strengthened glass may decrease. The content of $TiO_2$ is preferably 5% or less, more preferably 3% or less, still more preferably 2% or less, yet more preferably 1% or less, particularly preferably 0.5% or less, and further particularly preferably 0.25% or less.

$B_2O_3$ is not essential, but may be contained for a purpose of reducing brittleness of the glass and improving crack resistance, and for a purpose of improving the radio wave transparency. In a case where $B_2O_3$ is contained, a content of $B_2O_3$ is preferably 1.0% or more, more preferably 3.0% or more, still more preferably 4.0% or more, particularly preferably 5.0% or more, even more preferably 7.0% or more, and most preferably 8.0% or more. On the other hand, when the content of $B_2O_3$ is too high, acid resistance tends to deteriorate, and thus the content of $B_2O_3$ is preferably 25% or less. The content of $B_2O_3$ is more preferably 16% or less, still more preferably 13% or less, and particularly preferably 12% or less. The following is particularly preferable, 11% or less is more preferable, and 10% or less is most preferable. It is more preferable that $B_2O_3$ is not substantially contained in order to prevent the problem of striae occurring during melting.

$P_2O_5$ is not essential, but may be contained for a purpose of increasing the compressive stress layer during chemical strengthening. In a case where $P_2O_5$ is contained, a content of $P_2O_5$ is preferably 0.25% or more, more preferably 0.5% or more, still more preferably 0.75% or more, particularly preferably 1.0% or more, even still more preferably 1.25% or more, and most preferably 1.5% or more. From the viewpoint of increasing the acid resistance, the content of $P_2O_5$ is preferably 10% or less, more preferably 8% or less, still more preferably 6% or less, yet still more preferably 4% or less, particularly preferably 3% or less, even still more preferably 2.5% or less, and most preferably 2.0% or less. In order to prevent striae from occurring during melting, it is more preferable that $P_2O_5$ is not substantially contained.

A total content of $B_2O_3$ and $P_2O_5$ is preferably 0% to 35%, more preferably 5% or more, and still more preferably 8% or more. The total content of $B_2O_3$ and $P_2O_5$ is preferably 20% or less, more preferably 17% or less, and still more preferably 15% or less.

$Nb_2O_5$, $Ta_2O_5$, $Gd_2O_3$, and $CeO_2$ are components for preventing solarization of the glass and improving the meltability, and may be contained. In a case where these components are contained, the content of each component is preferably 0.03% or more, more preferably 0.1% or more, still more preferably 0.5% or more, particularly preferably 0.8% or more, and typically 1% or more. On the other hand, when the content of these components is too high, it is difficult to increase the compressive stress value during the chemical strengthening treatment, and thus the content is preferably 3% or less, more preferably 2% or less, still more preferably 1% or less, and particularly preferably 0.5% or less.

Furthermore, a coloring component may be added within a range that does not inhibit the achievement of desired chemical strengthening properties. Preferable examples of the coloring component include $Fe_2O_3$, $Co_3O_4$, $MnO_2$, NiO, CuO, $Cr_2O_3$, $V_2O_5$, $Bi_2O_3$, $SeO_2$, $CeO_2$, $Er_2O_3$, and $Nd_2O_3$.

A content of the coloring component is preferably 5% or less in total, in terms of molar percentage based on oxides. When the content exceeds 5%, the glass may tend to be devitrified. The content of the coloring component is preferably 3% or less, and more preferably 1% or less. When it is desired to increase the transmittance of the glass, it is preferable that these components are not substantially contained.

$SO_3$, a chloride, a fluoride, or the like may be appropriately contained as a refining agent during melting of the glass. $As_2O_3$ is preferably not contained. When $Sb_2O_3$ is contained, a content of $Sb_2O_3$ is preferably 0.3% or less, more preferably 0.1% or less, and it is most preferable that $Sb_2O_3$ is not contained.

A β-OH value is a value used as an index of a moisture content of the glass, and is a value acquired by measuring absorbance for light having a wavelength of 2.75 μm to 2.95 m and dividing the maximum value $\beta_{max}$ of the absorbance by a thickness (mm) of the glass.

The β-OH value is preferably 0.8 mm$^{-1}$ or less as the radio wave transparency of the glass can be further improved, and the β-OH value is preferably 0.6 mm$^{-1}$ or less, more preferably 0.5 mm$^{-1}$ or less, and still more preferably 0.4 mm$^{-1}$ or less.

Further, it is preferable that by setting the β-OH value to 0.05 mm$^{-1}$ or more, it is unnecessary to extremely reduce dissolution in an extreme dry atmosphere or a moisture content in a raw material, and the productivity, foam quality, and the like of the glass can be enhanced. The β-OH value is more preferably 0.1 mm$^{-1}$ or more, and still more preferably 0.2 mm$^{-1}$ or more.

The β-OH value can be adjusted by the composition of the glass, a heat source during melting, melting time, and the raw material.

A temperature (T2) at which the viscosity is 102 dPa s is preferably 1750° C. or lower, more preferably 1700° C. or lower, particularly preferably 1675° C. or lower, and typically 1650° C. or lower. The temperature (T2) is a temperature as a reference of a melting temperature of the glass, and the lower the T2 is, the more easily the glass tends to be produced. A lower limit of T2 is not particularly limited, but a glass having a low T2 tends to have an excessively low glass transition point, and thus T2 is generally 1400° C. or higher, and preferably 1450° C. or higher.

A temperature (T4) at which the viscosity is 104 dPa s is preferably 1350° C. or lower, more preferably 1300° C. or lower, still more preferably 1250° C. or lower, and particularly preferably 1150° C. or lower. The temperature (T4) is a temperature as a reference of a temperature at which the glass is formed into a sheet shape, and a glass having a high T4 tends to have a high load on a forming facility. A lower limit of T4 is not particularly limited, but a glass having a low T4 tends to have an excessively low glass transition point, and thus T4 is generally 900° C. or higher, preferably 950° C. or higher, and more preferably 1000° C. or higher.

A devitrification temperature of the present glass for chemical strengthening is preferably equal to or lower than a temperature that is higher by 120° C. than the temperature (T4) at which the viscosity is 104 dPa s because devitrification hardly occurs during forming by a float method. The devitrification temperature is more preferably equal to or lower than a temperature that is higher by 100° C. than the temperature (T4), still more preferably equal to or lower than a temperature that is higher by 50° C. than the temperature (T4), and particularly preferably T4 or lower.

A fracture toughness value of the present glass for chemical strengthening is preferably 0.70 MPa·m$^{1/2}$ or more, more preferably 0.75 MPa·m$^{1/2}$ or more, still more preferably 0.80 MPa·m$^{1/2}$ or more, and particularly preferably 0.83 MPa·m$^{1/2}$ or more. The fracture toughness value is generally 2.0 MPa·m$^{1/2}$ or less, and typically 1.5 MPa·m$^{1/2}$ or less. When the fracture toughness value is large, even if large surface compressive stress is introduced into the glass by chemical strengthening, intense crushing is less likely to occur.

The fracture toughness value can be measured using, for example, a DCDC method (Acta metall. mater. Vol. 43, pp. 3453-3458, 1995).

In order to make the glass harder to crush, a Young's modulus of the present glass for chemical strengthening is preferably 80 GPa or more, more preferably 82 GPa or more, still more preferably 84 GPa or more, and particularly preferably 85 GPa or more. An upper limit of the Young's modulus is not particularly limited, but the glass having a high Young's modulus may have low acid resistance, and thus the Young's modulus is, for example, preferably 110 GPa or less, more preferably 100 GPa or less, and still more preferably 90 GPa or less. The Young's modulus can be measured by, for example, an ultrasonic pulse method.

From the viewpoint of reducing warpage after the chemical strengthening, an average linear thermal expansion coefficient (a thermal expansion coefficient) of the present glass for chemical strengthening at 50° C. to 350° C. is preferably 95×10$^{-7}$/° C. or less, more preferably 90×10$^{-7}$/° C. or less, still more preferably 88×10$^{-7}$/° C. or less, particularly preferably $86 \times 10^{-7}$/° C. or less, and most preferably $84 \times 10^{-7}$/° C. or less. A lower limit of the thermal expansion coefficient is not particularly limited, but a glass having a small thermal expansion coefficient may be difficult to melt, and thus, the average linear thermal expansion coefficient (the thermal expansion coefficient) of the present glass for chemical strengthening at 50° C. to 350° C. is, for example, preferably $60 \times 10^{-7}$/° C. or more, more preferably $70 \times 10^{-7}$/° C. or more, still more preferably $74 \times 10^{-7}$/° C. or more, and particularly preferably $76 \times 10^{-7}$/° C. or more.

From the viewpoint of reducing warpage after the chemical strengthening, a glass transition point (Tg) is preferably 500° C. or higher, more preferably 520° C. or higher, and still more preferably 540° C. or higher. From the viewpoint of facilitating float molding, Tg is preferably 750° C. or lower, more preferably 700° C. or lower, still more preferably 650° C. or lower, particularly preferably 600° C. or lower, and most preferably 580° C. or lower.

The present glass for chemical strengthening can be produced by a usual method. For example, raw materials of the components of the glass are blended and heated and melted in a glass melting furnace. Thereafter, the glass is homogenized by a known method and formed into a desired shape such as a glass sheet, and is annealed.

Examples of a method of forming the glass sheet include a float method, a press method, a fusion method, and a down-draw method. In particular, the float method suitable for mass production is preferable. In addition, a continuous forming method other than the float method, such as a fusion method and a down-draw method, is also preferable.

Thereafter, the formed glass is subjected to a grinding and polishing treatment as necessary to form a glass substrate. If the glass substrate is cut into a predetermined shape and size, or subjected to chamfering, it is preferable to perform cutting and chamfering on the glass substrate before the chemical strengthening treatment to be described later is performed because a compressive stress layer is also formed on an end surface by a subsequent chemical strengthening treatment.

<<Glass Ceramics>>

The present glass for chemical strengthening may be glass ceramic (hereinafter, also referred to as "the present glass ceramic"). The present glass ceramics are glass ceramics having the glass composition of the above-described present glass for chemical strengthening.

The present glass ceramics preferably contains one or more of a lithium silicate crystal, a lithium aluminosilicate crystal, a lithium phosphate crystal, a magnesium aluminosilicate crystal, a magnesium silicate crystal, and a silicate crystal. As the lithium silicate crystal, a lithium metasilicate crystal is more preferable. As the lithium aluminosilicate crystal, a petalite crystal, a β-spodumene crystal, α-eucryptite, and β-eucryptite are preferable. As the lithium phosphate crystal, a lithium orthophosphate crystal is preferable.

In order to improve transparency, glass ceramics containing the lithium metasilicate crystal are more preferable.

The glass ceramics are obtained by heating and crystallizing an amorphous glass having the same composition as that of the present glass for chemical strengthening. A glass composition of the glass ceramics is the same as a composition of the amorphous glass.

In the glass ceramics, a visible light transmittance (a total visible light transmittance including diffuse transmitted light) is preferably 85% or more when converted into a value with a thickness of 700 μm, because a screen of a display can be easily seen when the glass ceramics are used as a cover glass of a portable display. The visible light transmittance is more preferably 88% or more, and still more preferably 90% or more. The visible light transmittance is preferably as high as possible, but is generally 93% or less. A visible light transmittance of a normal amorphous glass is about 90% or more.

When the thickness of the glass ceramics is not 700 m, the transmittance in a case of 700 μm can be calculated based on the measured transmittance using Lambert-Beer law.

In the case of the glass having the thickness t larger than 700 μm, the transmittance may be actually measured by adjusting the thickness to 0.7 mm by polishing, etching, or the like.

A haze value when converted into a value with a thickness of 700 μm is preferably 1.0% or less, more preferably 0.4% or less, still more preferably 0.3% or less, particularly preferably 0.2% or less, and most preferably 0.15% or less. The haze value is preferably as small as possible, but when a crystallization rate is lowered or a crystal grain size is decreased to decrease the haze value, mechanical strength is reduced. In order to increase the mechanical strength, the haze value in the case of a thickness of 700 μm is preferably 0.02% or more, and more preferably 0.03% or more. The haze value is a value measured in accordance with JIS K7136 (2000).

When the total visible light transmittance of the glass ceramics having the thickness t [mm] is $100 \times T$ [%], and the haze value is $100 \times H$ [%], $T = (1-R)^2 \times \exp(-\alpha t/1000)$ can be obtained using a constant $\alpha$ by incorporating the Lambert-Beer law. Using the constant $\alpha$, the following relation can be obtained.

$$dH/dt \propto \exp(-\alpha t/1000) \times (1-H)$$

That is, the haze value is considered to increase by an amount proportional to an internal linear transmittance as the thickness increases, and thus the haze value $H_{0.7}$ in the case of 700 μm is calculated by the following formula.

$$H_{0.7=100} \times [1-(1-H)^{\{((1-R)^2-T_{0.7})/(1-R)^2-T)\}}][\%] \qquad \text{[Math. 1]}$$

In the case of the glass having the thickness t larger than 700 μm, the haze value may be actually measured by adjusting the thickness to 700 μm by polishing, etching, or the like.

When a strengthened glass obtained by strengthening the glass ceramics is used for a cover glass of a portable display, the strengthened glass preferably has a texture and high quality appearance different from plastic. Therefore, the refractive index of the present glass ceramics is preferably 1.52 or more, more preferably 1.55 or more, and still more preferably 1.57 or more at a wavelength of 590 nm.

In order to increase the mechanical strength, the crystallization rate of the glass ceramics is preferably 5% or more, more preferably 10% or more, still more preferably 15% or more, and particularly preferably 20% or more. In order to improve the transparency, the crystallization rate is preferably 70% or less, more preferably 60% or less, and particularly preferably 50% or less. A small crystallization rate is also excellent to facilitate bending forming by heating.

The crystallization rate can be calculated from an X-ray diffraction intensity by a Rietveld method. The Rietveld method is described in "Crystal Analysis Handbook" edited by Editing Committee of the Crystallographic Society of Japan (Kyoritsu Shuppan, 1999, pp. 492-499).

An average grain size of precipitated crystals of the glass ceramics is preferably 80 nm or less, more preferably 60 nm or less, still more preferably 50 nm or less, particularly preferably 40 nm or less, and most preferably 30 nm or less. The average grain size of the precipitated crystals is determined from a transmission electron microscope (TEM) image. The average grain size of the precipitated crystals can be estimated from a scanning electron microscope (SEM) image.

<<Chemical Strengthening Treatment>>

The present chemically strengthened glass can be produced by subjecting the obtained glass sheet to the chemical strengthening treatment, followed by washing and drying.

The chemical strengthening treatment can be performed by a known method. In the chemical strengthening treatment, the glass sheet is brought into contact with a melt of a metal salt (for example, a potassium nitrate) containing metal ions (typically, K ions) having a large ionic radius by immersion or the like. Accordingly, metal ions having a small ionic radius (typically, Na ions or Li ions) in the glass sheet are substituted with metal ions having a large ionic radius (typically, K ions for Na ions and Na ions for Li ions).

The chemical strengthening treatment (ion exchange treatment) can be performed, for example, by immersing a glass sheet in a molten salt such as the potassium nitrate heated to 360° C. to 600° C. for 0.1 to 500 hours. The heating temperature for the molten salt is preferably, for example, 375° C. to 500° C., and the immersion time of the glass sheet in the molten salt is preferably, for example, 0.3 to 200 hours.

Examples of the molten salt for performing the chemical strengthening treatment include a nitrate, a sulfate, a carbonate, and a chloride. Examples of the nitrate include lithium nitrate, sodium nitrate, potassium nitrate, cesium nitrate, and silver nitrate. Examples of the sulfate include lithium sulfate, sodium sulfate, potassium sulfate, cesium sulfate, and silver sulfate. Examples of the carbonate include lithium carbonate, sodium carbonate, and potassium carbonate. Examples of the chloride include lithium chloride, sodium chloride, potassium chloride, cesium chloride, and silver chloride. One of these molten salts may be used alone, or a plurality thereof may be used in combination.

In the present invention, appropriate treatment conditions of the chemical strengthening treatment may be selected in consideration of the properties and composition of the glass, the kind of the molten salt, and the chemical strengthening properties such as the entropy function S, the surface compressive stress, and the depth of compressive stress layer desired for the chemically strengthened glass finally obtained.

In the present invention, the chemical strengthening treatment may be performed only once, or may be performed a plurality of times under two or more different conditions (multistage strengthening). Here, for example, as a chemical strengthening treatment in a first stage, the chemical strengthening treatment is performed under a condition that DOL is large and CS is relatively small. Thereafter, as a chemical strengthening treatment in a second stage, when the chemical strengthening treatment is performed under a condition that DOL is small and CS is relatively high, an internal tensile stress area (St) can be reduced while increasing CS of the outermost surface of the chemically strengthened glass, and the internal tensile stress (CT) can be kept low.

<Electronic Device Housing>

The electronic device housing of the present invention includes the chemically strengthened glass of the present invention. Examples of the electronic device housing include a cover glass for a display surface and a back surface of a mobile terminal, a cover glass of a display device such as a television (TV), a personal computer (PC), or a touch panel, which is not intended to be carried.

EXAMPLES

Hereinafter, the present invention will be described with reference to Examples, but the present invention is not limited thereto.

Experimental Example 1

Glass raw materials were blended and weighed such that the glass has a weight of 400 g. Next, the mixed raw materials were put into a platinum crucible, followed by being put into an electric furnace at 1500° C. to 1700° C., and were melted for about 3 hours, defoamed, and homogenized.

Among the obtained various chemically strengthened glasses, a glass in which a relative permittivity or a dielectric loss tangent after chemical strengthening was decreased compared to before the chemical strengthening was regarded as a chemically strengthened glass having increased radio wave transparency by the chemical strengthening. The FIG. 1s a graph showing a correlation between the radio wave transparency at a frequency of 10 GHz, an entropy function, and compressive stress for the glass whose radio wave transparency is increased by the chemical strengthening. In the FIGURE, a vertical axis represents a total value of the relative permittivity and a value acquired by multiplying the dielectric loss tangent by 100, which are changed before and after the chemical strengthening, and a horizontal axis represents a parameter Z that can be calculated from the entropy function and the compressive stress before and after the chemical strengthening.

A content of alkali metal ions for calculating an entropy function was measured using Electron Probe Micro Analyzer (EPMA, JXA-8500F manufactured by JEOL Ltd.). Measurement conditions of EPMA were an acceleration voltage of 15 kV, a probe current of 30 nA, an integration time 1000 msec./point, and an interval of 1 m.

According to the FIGURE, it could be seen that since Z represented by the formula $[Z=(S2-S1)\times10+X/1000]$ is 0.65 or more, the movement of alkali metal ions after the chemical strengthening is prevented compared to before the chemical strengthening, and excellent radio wave transparency is exhibited in a high frequency band.

Experimental Example 2

Glass raw materials were blended in a manner of having compositions shown in Table 1 in terms of molar percentage based on oxides, and weighed such that the glass has a weight of 400 g. Next, the mixed raw materials were put into a platinum crucible, followed by being put into an electric furnace at 1500° C. to 1700° C., and were melted for about 3 hours, defoamed, and homogenized.

The obtained molten glass was poured into a metal mold, held at a temperature about 50° C. higher than a glass transition point for 1 hour, and then cooled to reach room temperature at a rate of 0.5° C./min to obtain a glass block. The obtained glass block was cut and ground, and finally both surfaces were mirror-polished to obtain a glass sheet having a thickness (t) of 700 μm.

A relative permittivity and a dielectric loss tangent tan α at 20° C. and a frequency of 10 GHz of each glass were measured. Results are shown in Table 2. In addition, the chemical strengthening treatment was performed in two stages under conditions shown in Table 2 to produce chemically strengthened glasses of the following Examples 1 to 7.

Examples 1 to 4 are Working Examples, and Examples 5 to 7 are Comparative Examples.

TABLE 1

| (mol %) | Glass Number | | | | | | |
|---|---|---|---|---|---|---|---|
| | 1 | 2 | 3 | 4 | 5 | 6 | 7 |
| $SiO_2$ | 54.0 | 62.1 | 75.0 | 66.0 | 70.0 | 66.2 | 66.0 |
| $Al_2O_3$ | 17.0 | 13.0 | 10.0 | 10.0 | 7.5 | 11.2 | 16.6 |
| $B_2O_3$ | 9.0 | 8.0 | 0.0 | 3.0 | 0.0 | 0.0 | 0.4 |
| $P_2O_5$ | 1.0 | 2.4 | 0.0 | 0.0 | 0.0 | 0.0 | 0.0 |
| MgO | 2.0 | 0.0 | 0.0 | 2.0 | 7.0 | 3.1 | 0.3 |
| CaO | 1.0 | 0.0 | 0.0 | 2.0 | 0.2 | 0.2 | 0.0 |
| SrO | 0.0 | 2.0 | 0.0 | 2.0 | 0.0 | 0.0 | 0.0 |
| BaO | 0.0 | 1.0 | 0.0 | 1.5 | 0.0 | 0.0 | 0.0 |
| ZnO | 0.0 | 0.0 | 0.0 | 0.0 | 0.0 | 0.0 | 0.0 |
| $TiO_2$ | 0.0 | 0.0 | 0.0 | 0.0 | 0.0 | 0.0 | 0.0 |
| $ZrO_2$ | 1.0 | 0.0 | 1.0 | 1.0 | 1.0 | 1.3 | 0.0 |
| $Y_2O_3$ | 1.0 | 0.0 | 0.0 | 0.0 | 0.0 | 0.5 | 0.0 |
| $Li_2O$ | 10.0 | 8.0 | 14.0 | 8.0 | 8.0 | 10.4 | 7.2 |
| $Na_2O$ | 4.0 | 3.5 | 0.0 | 2.5 | 5.3 | 5.6 | 9.0 |
| $K_2O$ | 0.0 | 0.0 | 0.0 | 2.0 | 1.0 | 1.5 | 0.5 |
| Sum | 100.0 | 100.0 | 100.0 | 100.0 | 100.0 | 100.0 | 100.0 |

Compressive stress of a surface layer and a depth of compressive stress layer DOL after the chemical strengthening were measured using an optical waveguide surface stress meter FSM-6000 and a scattered light photoelastic stress meter SLP-1000 manufactured by Orihara Industrial Co., Ltd., and an average value of the compressive stress in a region from the surface layer to 0.05t μm was described as internal average chemical strengthening stress.

For the obtained sample, a content of alkali metal ions after the chemical strengthening at a depth of 0.05t from the glass surface and a content of alkali metal ions at a sheet thickness center (a glass center portion), which were obtained using an electron probe micro analyzer (EPMA JXA-8500F, manufactured by JEOL Ltd.), were measured. Average values thereof are shown in Table 2 as the ion amount after strengthening and the ion amount at the sheet thickness center.

The entropy function S was calculated from the obtained ion amount of the alkali metal element according to the following definition formula.

$$S = -[Li_2O]/([Li_2O]+[Na_2O]+[K_2O])\log([Li_2O]/([Li_2O]+[Na_2O]+[K_2O]))-[Na_2O]/([Li_2O]+[Na_2O]+[K_2O])\log([Na_2O]/([Li_2O]+[Na_2O]+[K_2O]))-[K_2O]/([Li_2O]+[Na_2O]+[K_2O])\log([K_2O]/([Li_2O]+[Na_2O]+[K_2O]))$$

An entropy function calculated from the average amount of alkali ions from the glass surface to the depth of 0.05t is defined as S2, and an entropy function calculated from the amount of alkali ions at the center portion of the glass is defined as S1. An alkali fixed parameter Z was calculated by the following formula from the entropy functions S1 and S2 and the average value X [unit: MPa] of the compressive stress in the region from the glass surface to the depth of 0.05t. Results are shown in Table 2. In Table 2, the "amount of change in entropy function" was calculated by subtracting the "entropy function S1 of the sheet thickness center (a glass center)" from the "entropy function S2 after chemical strengthening".

$$Z = (S2-S1) \times 10 + X/1000$$

Further, the relative permittivity and tan δ at 20° C. and a frequency of 10 GHz of the sample after the chemical strengthening were measured. Results are shown in Table 2.

The relative permittivity and tan δ were measured by the split post dielectric resonator method (the SPDR method) using the network analyzer. The measurement conditions were a temperature of 20° C. and a frequency of 10 GHz.

In Table 2, the "amount of change in relative permittivity due to chemical strengthening" was calculated by subtracting the "relative permittivity before chemical strengthening" from the "relative permittivity after chemical strengthening". The "amount of change in dielectric loss due to chemical strengthening" was calculated by subtracting the "dielectric loss before chemical strengthening" from the "dielectric loss after chemical strengthening".

TABLE 2

| | | Examples | | | |
|---|---|---|---|---|---|
| | Glass Number | 1 | 2 | 3 | 4 |
| | | 1 | 2 | 3 | 4 |
| First Chemical Strengthening Conditions | Li ion concentration [mass %] | 0.0 | 0.0 | 0.0 | 0.0 |
| | Na ion concentration [mass %] | 100.0 | 100.0 | 100.0 | 100.0 |
| | K ion concentration [mass %] | 0.0 | 0.0 | 0.0 | 0.0 |
| | Temperature [° C.] | 450 | 450 | 450 | 450 |
| | Time [h] | 2 | 1 | 1 | 1 |
| Second Chemical Strengthening Conditions | Li ion concentration [mass %] | 0 | 0 | 0 | 0 |
| | Na ion concentration [mass %] | 0 | 0 | 0 | 0 |
| | K ion concentration [mass %] | 100 | 100 | 100 | 100 |
| | Temperature | 450 | 450 | 450 | 450 |
| | Time [h] | 1 | 1 | 1 | 1 |
| Entropy Function | Li ion amount of sheet thickness center | 10.0 | 8 | 14 | 8 |
| | Na ion amount of sheet thickness center | 5.0 | 4 | 0 | 3 |
| | K ion amount of sheet thickness center | 0 | 0 | 0 | 2 |
| | Entropy function S1 of sheet thickness center | 0.276 | 0.267 | 0.000 | 0.391 |
| | Li ion amount after chemical strengthening | 6.3 | 5.2 | 4.1 | 4.7 |
| | Na ion amount after chemical strengthening | 8.3 | 5.7 | 6.6 | 4.6 |
| | K ion amount after chemical strengthening | 0.5 | 0.5 | 0.8 | 2.2 |

TABLE 2-continued

| | Examples | 1 | 2 | 3 | 4 |
|---|---|---|---|---|---|
| | Glass Number | 1 | 2 | 3 | 4 |
| | Entropy function S2 after chemical strengthening | 0.347 | 0.369 | 0.379 | 0.457 |
| | Amount of change in entropy function S2-S1 | 0.071 | 0.102 | 0.379 | 0.065 |
| Strengthening Stress | Surface compressive stress $CS_0$ [MPa] | 1000 | 680 | 600 | 800 |
| | Internal chemical strengthening stress $CS_{0.05t}$ [MPa] | 295 | 208 | 322 | 161 |
| | Internal average chemical strengthening stress X [MPa] | 354 | 249 | 386 | 193 |
| | Depth of compressive stress layer [μm] | 80 | 100 | 220 | 70 |
| | Alkali Fixed Parameter Z | 1.064 | 1.274 | 4.174 | 0.847 |
| Dielectric Properties | Relative permittivity before chemical strengthening | 6.7 | 5.9 | 6.2 | 6.6 |
| | Relative permittivity after chemical strengthening | 6.6 | 5.9 | 6.0 | 6.6 |
| | Amount of change in relative permittivity due to chemical strengthening | −0.10 | −0.02 | −0.12 | −0.05 |
| | Dielectric loss before chemical strengthening | 0.012 | 0.012 | 0.021 | 0.010 |
| | Dielectric loss after chemical strengthening | 0.012 | 0.012 | 0.017 | 0.010 |
| | Amount of change in dielectric loss due to chemical strengthening | 0.0000 | 0.0000 | −0.0045 | −0.0002 |

| | Examples | 5 | 6 | 7 |
|---|---|---|---|---|
| | Glass Number | 5 | 6 | 7 |
| First Chemical Strengthening Conditions | Li ion concentration [mass %] | 0.0 | 0.0 | 0.0 |
| | Na ion concentration [mass %] | 100.0 | 100.0 | 70.0 |
| | K ion concentration [mass %] | 0.0 | 0.0 | 30.0 |
| | Temperature [° C.] | 450 | 410 | 400 |
| | Time [h] | 2 | 2 | 3 |
| Second Chemical Strengthening Conditions | Li ion concentration [mass %] | 0 | 0 | 0 |
| | Na ion concentration [mass %] | 0 | 1 | 3 |
| | K ion concentration [mass %] | 100 | 99 | 97 |
| | Temperature | 425 | 440 | 400 |
| | Time [h] | 2 | 1 | 1 |
| Entropy Function | Li ion amount of sheet thickness center | 8 | 10 | 7 |
| | Na ion amount of sheet thickness center | 5 | 6 | 9 |
| | K ion amount of sheet thickness center | 1 | 2 | 1 |
| | Entropy function S1 of sheet thickness center | 0.382 | 0.384 | 0.348 |
| | Li ion amount after chemical strengthening | 5.3 | 7.0 | 3.5 |
| | Na ion amount after chemical strengthening | 7.5 | 8.4 | 11.7 |
| | K ion amount after chemical strengthening | 1.5 | 2.1 | 1.5 |
| | Entropy function S2 after chemical strengthening | 0.408 | 0.423 | 0.345 |
| | Amount of change in entropy function S2-S1 | 0.027 | 0.038 | −0.003 |
| Strengthening Stress | Surface compressive stress $CS_0$ [MPa] | 900 | 900 | 800 |
| | Internal chemical strengthening stress $CS_{0.05t}$ [MP a] | 121 | 188 | 134 |
| | Internal average chemical strengthening stress X [MPa] | 145 | 225 | 161 |
| | Depth of compressive stress layer [μm] | 125 | 130 | 125 |
| | Alkali Fixed Parameter Z | 0.412 | 0.610 | 0.128 |
| Dielectric Properties | Relative permittivity before chemical strengthening | 6.3 | 6.6 | 6.4 |
| | Relative permittivity after chemical strengthening | 6.3 | 6.7 | 6.5 |
| | Amount of change in relative permittivity due to chemical strengthening | 0.00 | 0.10 | 0.10 |
| | Dielectric loss before chemical strengthening | 0.017 | 0.017 | 0.021 |

TABLE 2-continued

| Examples | 1 | 2 | 3 | 4 |
|---|---|---|---|---|
| Glass Number | 1 | 2 | 3 | 4 |
| Dielectric loss after chemical strengthening | 0.019 | 0.017 | 0.025 | |
| Amount of change in dielectric loss due to chemical strengthening | 0.0020 | 0.0000 | 0.0040 | |

As shown in Table 2, in Examples 1 to 4 which are Working Examples, it can be confirmed that the amount of change in entropy function between before and after the chemical strengthening is very large and the compressive stress in the vicinity of the glass surface layer is high, and thus the alkali fixed parameter Z is 0.65 or more, and as a result, the physical properties of any of the relative permittivity and the dielectric loss are lowered between before and after the chemical strengthening treatment and the dielectric properties are improved.

In Examples 5 to 7 which are Comparative Examples, it can be confirmed that the amount of change in entropy function between before and after the chemical strengthening is small, and thus the alkali fixed parameter Z is less than 0.65, and as a result, the relative permittivity and the dielectric loss are both increased and the dielectric properties are lowered by performing the chemical strengthening treatment.

Although the present invention has been described in detail with reference to specific embodiments, it is apparent to those skilled in the art that various changes and modifications can be made without departing from the spirit and the scope of the present invention. In addition, all references cited here are entirely incorporated.

The invention claimed is:

1. A chemically strengthened glass having a thickness of t (unit: μm) and a relative permittivity of 7.0 or less at 20° C. and a frequency of 10 GHz, and having a base composition comprising, in terms of molar percentage based on oxides:

10% or less of $Al_2O_3$;

2% or less of $K_2O$;

3% or less of MgO; and

14% or more of $Li_2O$ and/or $Na_2O$ in total, wherein a value of Z determined by the following formula is 0.65 or more and a value of S1 is 0.2 or less, where S1 is an entropy function calculated from an amount of alkali ions in a center portion of the glass, S2 is an entropy function calculated from an average amount of alkali ions from a glass surface to a depth of 0.05t, and X (unit: MPa) is an average value of a compressive stress in a region from the glass surface to the depth of 0.05t:

$$Z=(S2-S1)\times10+X/1000,$$

provided that an entropy function S is calculated by the following formula from $[Li_2O]$, $[Na_2O]$, and $[K_2O]$ which are contents of $Li_2O$, $Na_2O$, and $K_2O$ respectively in terms of molar percentage based on oxides, and in the formula, when $[Li_2O]$, $[Na_2O]$, and $[K_2O]$ are zero, the entropy function S is $1\times10^{-4}$:

$$S=-[Li_2O]/([Li_2O]+[Na_2O]+[K_2O])\log([Li_2O]/([Li_2O]+[Na_2O]+[K_2O]))-[Na_2O]/([Li_2O]+[Na_2O]+[K_2O])\log([Na_2O]/([Li_2O]+[Na_2O]+[K_2O]))-[K_2O]/([Li_2O]+[Na_2O]+[K_2O])\log([K_2O]/([Li_2O]+[Na_2O]+[K_2O])), and$$

a content of Li ions after the chemical strengthening at the depth of 0.05t from the glass surface is greater than or equal to 4.1 mol %.

2. The chemically strengthened glass according to claim 1, wherein a value of (S2−S1) obtained by subtracting the entropy function S1 from the entropy function S2 is 0.04 or more.

3. The chemically strengthened glass according to claim 1, having a dielectric loss tangent of 0.02 or less at 20° C. and a frequency of 10 GHz.

4. The chemically strengthened glass according to claim 1, wherein the base composition comprises in terms of molar percentage based on oxides:

40% to 80% of $SiO_2$;

0% to 20% of $B_2O_3$;

1% to 10% of $Al_2O_3$; and

14% to 30% of $Li_2O$ and/or $Na_2O$ in total.

5. The chemically strengthened glass according to claim 1, having a surface compressive stress value $CS_0$ of 300 MPa or more.

6. The chemically strengthened glass according to claim 1, having an internal chemical strengthening stress $CS_{0.05t}$ at a depth of 0.05t from the glass surface of 75 MPa or more, wherein the thickness t is 300 μm or more.

7. The chemically strengthened glass according to claim 1, having a depth of a compressive stress layer DOL of 70 μm or more, wherein the thickness t is 350 μm or more.

8. The chemically strengthened glass according to claim 1, being a lithium aluminosilicate glass, wherein the base composition comprises, in terms of molar percentage based on oxides:

40% to 70% of $SiO_2$;

7.5% to 10% of $Al_2O_3$; and

5% to 25% of $Li_2O$.

9. The chemically strengthened glass according to claim 1, wherein the thickness t is 100 μm or more and 2000 μm or less.

10. The chemically strengthened glass according to claim 1, being a glass ceramic.

11. The chemically strengthened glass according to claim 1, having a dielectric loss tangent of 0.018 or less at 20° C. and a frequency of 10 GHz.

12. An electronic device housing comprising the chemically strengthened glass according to claim 1.

* * * * *